(12) United States Patent
Van Der Zanden et al.

(10) Patent No.: US 9,059,302 B2
(45) Date of Patent: Jun. 16, 2015

(54) FLOATING GATE MEMORY DEVICE WITH AT LEAST PARTIALLY SURROUNDING CONTROL GATE

(75) Inventors: Koen Van Der Zanden, Leuven (BE); Thomas Schulz, Heverlee (BE)

(73) Assignee: Infineon Technologies AG, Neubiberg (DE)

( * ) Notice: Subject to any disclaimer, the term of this patent is extended or adjusted under 35 U.S.C. 154(b) by 746 days.

(21) Appl. No.: 12/418,623

(22) Filed: Apr. 6, 2009

(65) Prior Publication Data

US 2010/0252874 A1 Oct. 7, 2010

(51) Int. Cl.
| | |
|---|---|
| *H01L 21/00* | (2006.01) |
| *H01L 29/788* | (2006.01) |
| *H01L 21/28* | (2006.01) |
| *H01L 29/423* | (2006.01) |
| *H01L 29/66* | (2006.01) |

(52) U.S. Cl.
CPC ...... *H01L 29/7881* (2013.01); *H01L 21/28273* (2013.01); *H01L 29/42324* (2013.01); *H01L 29/66825* (2013.01)

(58) Field of Classification Search
CPC ............ H01L 29/7881; H01L 21/28273; H01L 29/66825; H01L 29/42324
See application file for complete search history.

(56) References Cited

U.S. PATENT DOCUMENTS

| | | | | |
|---|---|---|---|---|
| 4,868,619 | A * | 9/1989 | Mukherjee et al. | 257/300 |
| 5,932,910 | A * | 8/1999 | Hong | 257/321 |
| 6,069,382 | A * | 5/2000 | Rahim | 257/316 |
| 6,136,652 | A * | 10/2000 | Hazani | 438/260 |
| 6,157,058 | A * | 12/2000 | Ogura | 257/315 |
| 6,306,708 | B1 | 10/2001 | Peng | |
| 6,319,774 | B1 | 11/2001 | Hai | |
| 6,525,369 | B1 * | 2/2003 | Wu | 257/315 |
| 6,630,381 | B1 * | 10/2003 | Hazani | 438/260 |
| 6,897,514 | B2 * | 5/2005 | Kouznetsov et al. | 257/314 |
| 7,250,337 | B2 * | 7/2007 | Lee | 438/257 |
| 7,411,242 | B2 | 8/2008 | Kobayashi et al. | |
| 7,473,600 | B2 | 1/2009 | Yoo et al. | |
| 7,494,870 | B2 | 2/2009 | Chien et al. | |
| 7,512,005 | B2 | 3/2009 | Mokhlesi | |
| 2002/0125525 | A1 | 9/2002 | Rosner et al. | |
| 2003/0001191 | A1 * | 1/2003 | Forbes et al. | 257/306 |
| 2003/0122184 | A1 | 7/2003 | Park | |
| 2003/0156460 | A1 * | 8/2003 | Wu | 365/185.33 |
| 2006/0138522 | A1 | 6/2006 | Kim | |
| 2006/0186460 | A1 * | 8/2006 | Choi et al. | 257/315 |
| 2006/0192243 | A1 * | 8/2006 | Bhattacharyya | 257/315 |
| 2006/0284242 | A1 * | 12/2006 | Jo | 257/316 |
| 2007/0004134 | A1 * | 1/2007 | Vora | 438/257 |
| 2007/0023815 | A1 * | 2/2007 | Oh et al. | 257/314 |
| 2007/0066017 | A1 | 3/2007 | Forbes et al. | |
| 2007/0090443 | A1 * | 4/2007 | Choi et al. | 257/314 |
| 2007/0181936 | A1 * | 8/2007 | Hsieh et al. | 257/315 |
| 2007/0278553 | A1 * | 12/2007 | Wu | 257/314 |

(Continued)

OTHER PUBLICATIONS

John M. Caywood; Chih-Jen Huang; Y.J. Chang; A Nonvolatile Memory Cell Suitable for Both Flash and Byte-Writable Applications; IEEE Transaction on Electron Devices; May 2002; pp. 802-807; vol. 49, No. 5.

*Primary Examiner* — Laura Menz
(74) *Attorney, Agent, or Firm* — Slater & Matsil, L.L.P.

(57) ABSTRACT

One or more embodiments relate to a floating gate memory device, comprising: a substrate; a floating gate disposed over the substrate; and a control gate substantially laterally surrounding at least a portion of the floating gate.

22 Claims, 6 Drawing Sheets

(56) References Cited

U.S. PATENT DOCUMENTS

| | | |
|---|---|---|
| 2008/0002475 A1 | 1/2008 | Yang et al. |
| 2008/0070363 A1* | 3/2008 | Mokhlesi ........................ 438/266 |
| 2008/0121970 A1* | 5/2008 | Aritome ......................... 257/316 |
| 2008/0277719 A1 | 11/2008 | Choi et al. |
| 2008/0303079 A1* | 12/2008 | Cho et al. ....................... 257/321 |
| 2008/0308857 A1* | 12/2008 | Yih et al. ....................... 257/316 |
| 2009/0026525 A1* | 1/2009 | Wang et al. .................... 257/316 |
| 2009/0039420 A1* | 2/2009 | Trivedi et al. .................. 257/329 |
| 2009/0230455 A1* | 9/2009 | Zhu ................................ 257/321 |
| 2009/0242957 A1* | 10/2009 | Ma et al. ........................ 257/316 |
| 2010/0009503 A1* | 1/2010 | Kai et al. ....................... 438/257 |
| 2010/0176434 A1* | 7/2010 | Ma et al. ........................ 257/319 |
| 2010/0252874 A1* | 10/2010 | Schulz et al. .................. 257/315 |
| 2011/0230033 A1 | 9/2011 | Aritome |

* cited by examiner

FLOATING GATE MEMORY DEVICE WITH AT LEAST PARTIALLY SURROUNDING CONTROL GATE

FIELD OF THE INVENTION

Generally, the present invention relates to semiconductor devices and methods of making semiconductor devices.

BACKGROUND OF THE INVENTION

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

One type of semiconductor device is a memory device, in which data is typically stored as a logical "1" or "0". One type of memory device is a floating gate device.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1A:
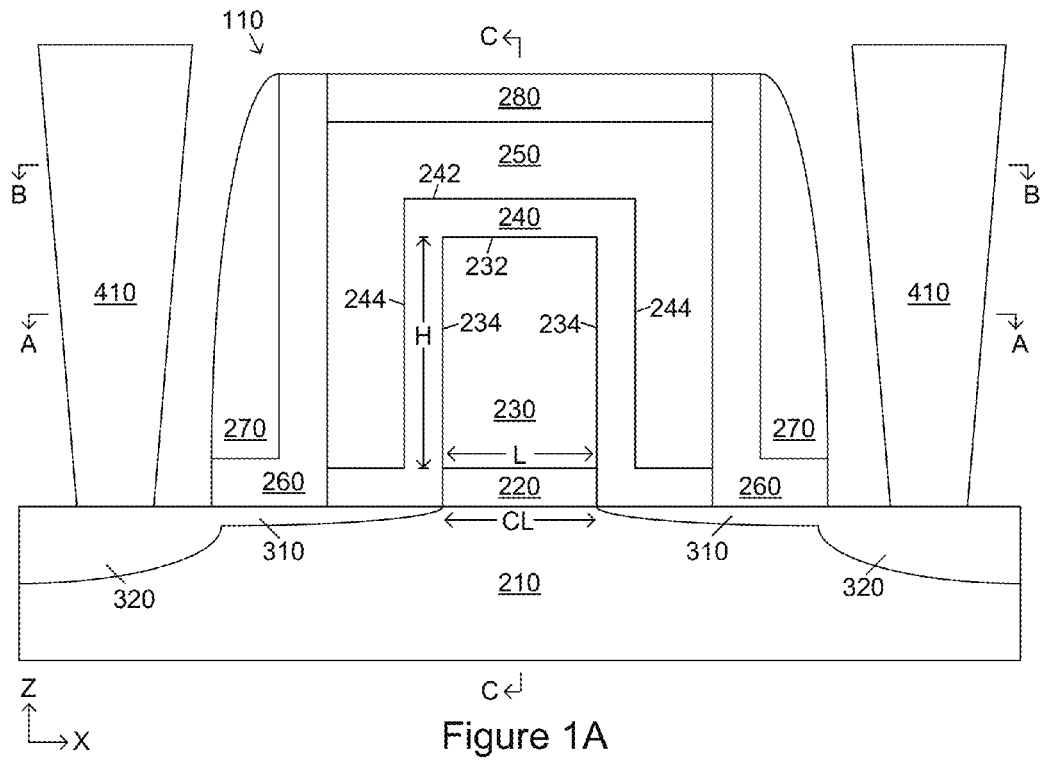
FIGS. 1A, 1B, 1C and 1D show cross-sectional views of an embodiment of a memory device of the present invention.
Figure 1B:
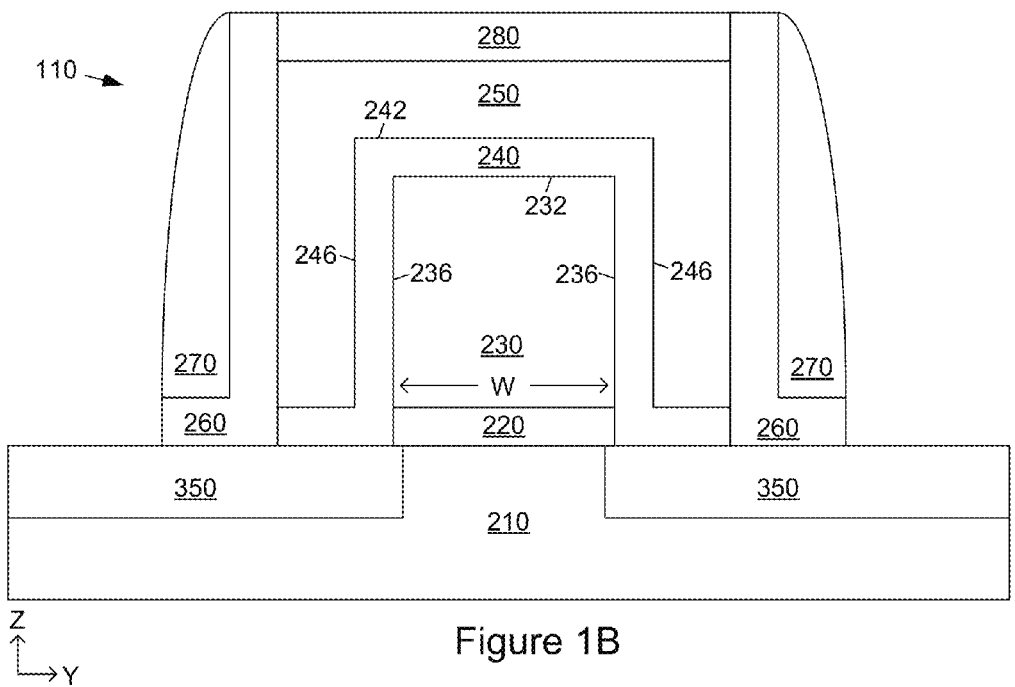
Figure 1C:
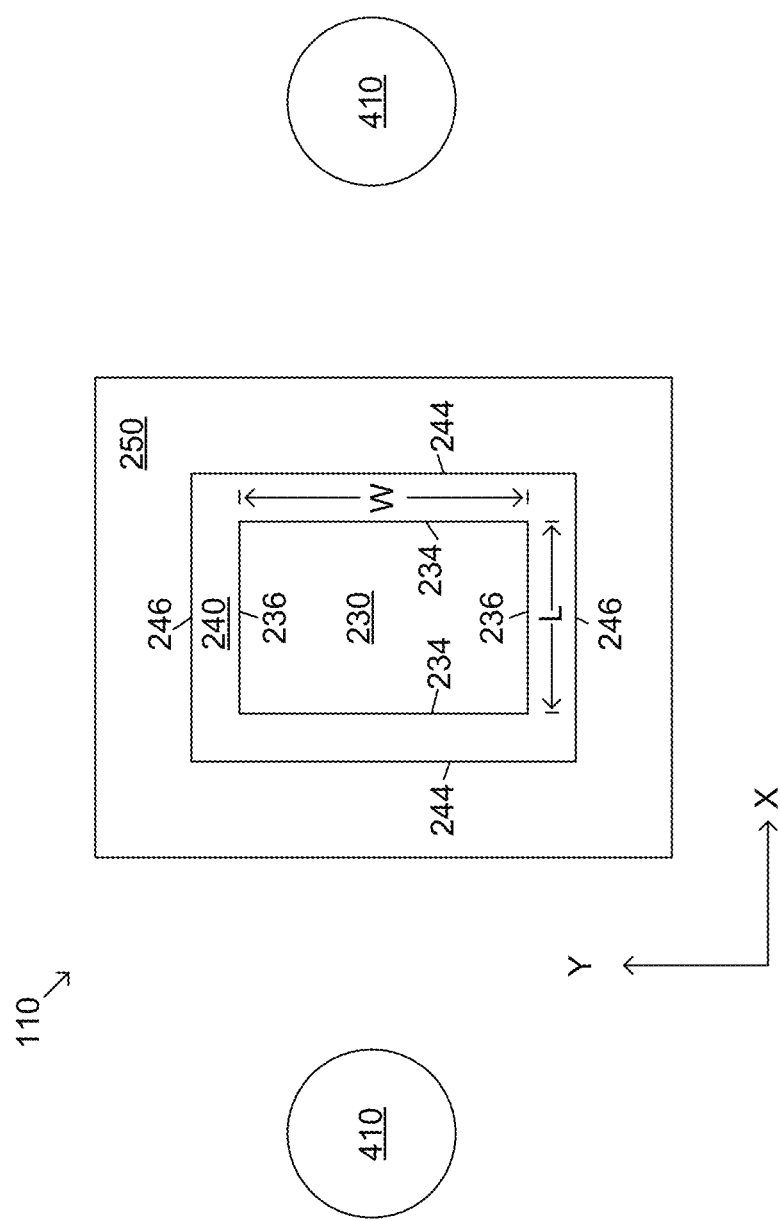
Figure 1D:
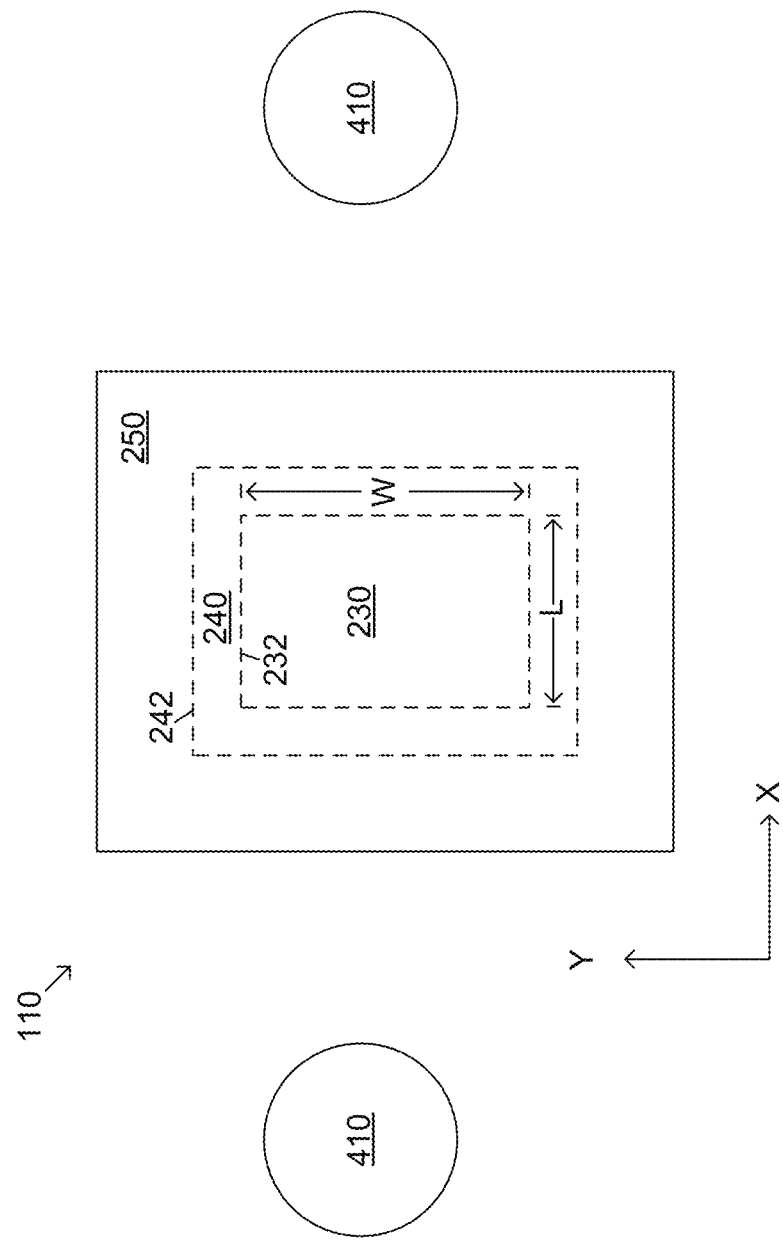

FIGS. 1A-D (i.e., FIGS. 1A, 1B, 1C, 1D) show a memory device 110 which is an embodiment of the present invention. FIG. 1A shows a cross sectional view of the memory device in an X-Z plane (e.g. a plane where Y has a constant value). The cross section in FIG. 1A is parallel to the length L of the floating gate 230. FIG. 1B shows a cross sectional view of the same memory device in a Y-Z plane (e.g. a plane where X has a constant value) through the cross section C-C shown in FIG. 1A. The cross section of FIG. 1B is parallel to the width W of the floating gate 230. Conductive contact plugs 410 will be explained below. FIG. 1C shows a cross sectional view (looking downward) of the memory device 110 in an X-Y plane (e.g. a plane where Z has a constant value) through the cross section A-A shown in FIG. 1A. FIG. 1C (for simplicity) does not show the layer 260 or the layer 270. FIG. 1D shows a cross sectional view (looking downward) of the memory device 110 in an X-Y plane through the cross section B-B shown in FIG. 1A. This is a cross section through the control gate 250 and above the top surface 242 of second dielectric layer 240. FIG. 1D (for simplicity) does not show the layer 260 or the layer 270. FIG. 1D shows second dielectric layer 240 disposed over the top surface 232 of floating gate 230. FIG. 1D shows control gate 250 disposed over the top surface 242 of second dielectric layer 240.

Figure 2A:
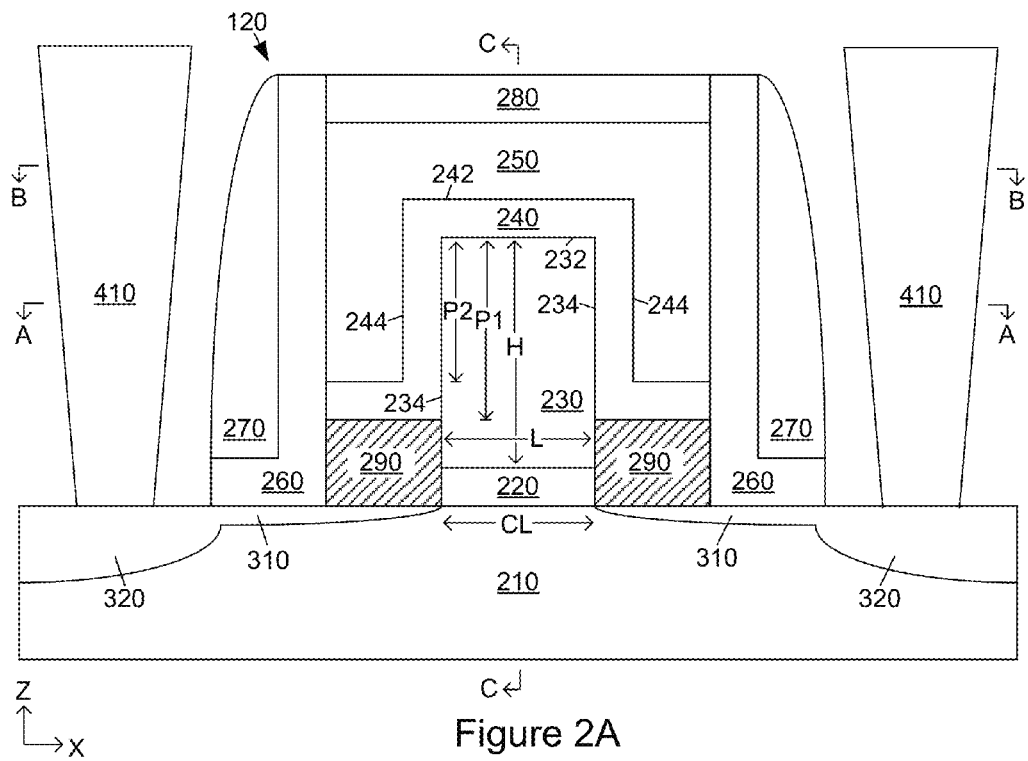
FIGS. 2A, 2B, 2C and 2D show cross-sectional views of an embodiment of a memory device of the present invention.
Figure 2B:
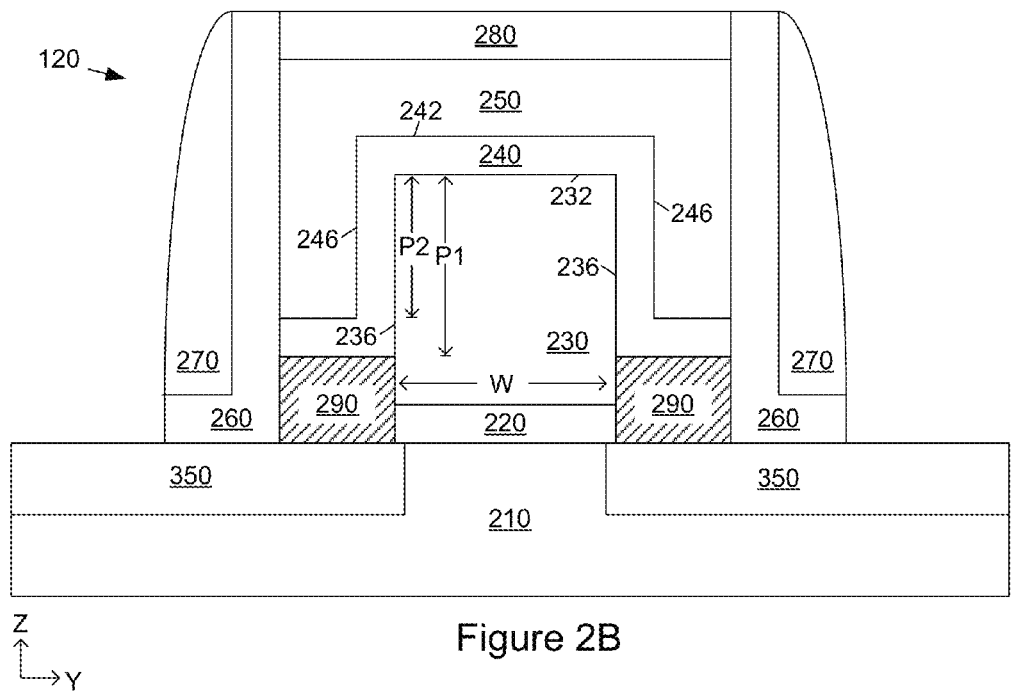
Figure 2C:
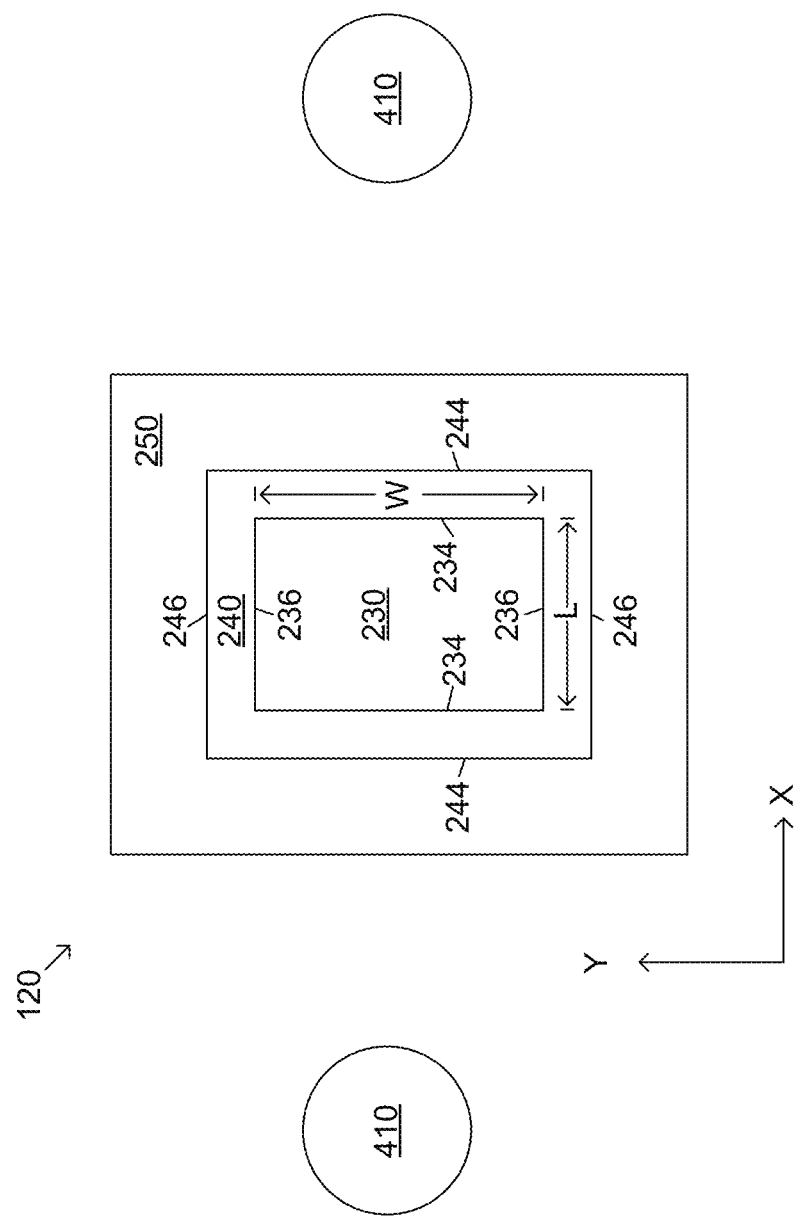
Figure 2D:
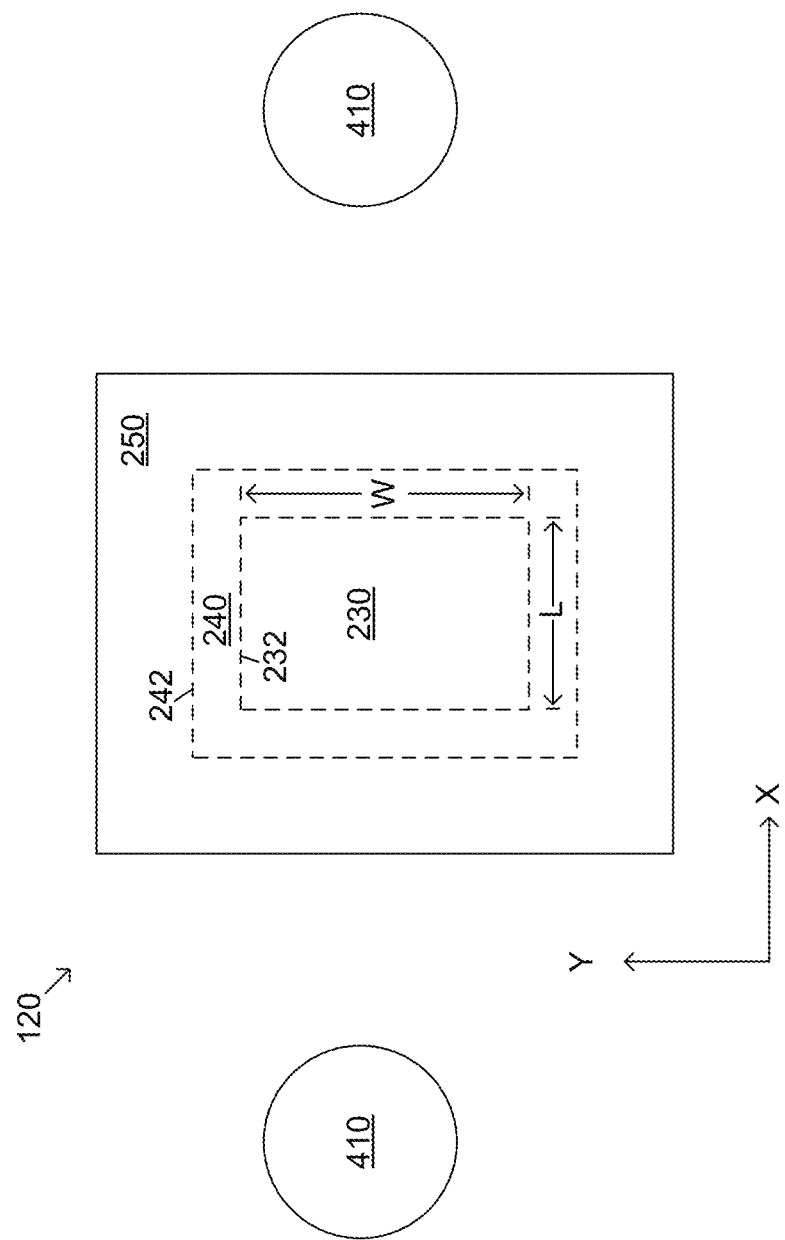

FIGS. 2A-D (i.e., FIGS. 2A, 2B, 2C and 2D) show a memory device 120 which is also an embodiment of the present invention. FIG. 2A shows a cross sectional view of the memory device 120 in an X-Z plane. The cross section of FIG. 2A is parallel to the length L of the floating gate 230. FIG. 2B shows a cross sectional view of the same memory device 120 in a Y-Z plane through the cross section C-C shown in FIG. 2A. The cross section of FIG. 2B is parallel to the width W of the floating gate 203. Conductive contact plugs 410 will be explained below. FIG. 2C shows a cross sectional view (looking downward) of the same memory device 120 in an X-Y plane through the cross section A-A shown in FIG. 2A. FIG. 2C (for simplicity) does not show the layer 260 or the layer 270. FIG. 2D shows a cross sectional view (looking downward) of the memory device 120 in an X-Y plane through the cross section B-B shown in FIG. 2A. This is a cross section through the control gate 250 and above the top surface 242 of the second dielectric layer 240. FIG. 2D (for simplicity) does not show the layer 260 or the layer 270. FIG. 2D shows second dielectric layer 240 disposed over the top surface 232 of floating gate 230. FIG. 2D shows control gate 250 disposed over the top surface 242 of second dielectric layer 240.

In the embodiment of FIGS. 2A-D, the bottom surfaces of the second dielectric layer 240 as well as the bottom surfaces of the control gate 250 are raised with the use of dielectric blocks 290 to further decouple the control gate 250 from the source/drain extension regions 310 and/or from the source/drain regions 320. Other ways may also be used to increase the distance of the control gate 250 from the source/drain extension regions 310 and/or from the source/drain regions 320.

Referring to FIGS. 1A-D and FIGS. 2A-D, the X-direction, Y-direction and Z-direction may be perpendicular to each other.

Referring to FIGS. 1A,1B or to FIGS. 2A,2B a semiconductor substrate 210 is provided. The substrate 210 may be any type of substrate. In one or more embodiments, the substrate may be a semiconductor substrate. In one or more embodiments, the substrate may be a p-type substrate. In one or more embodiments, the substrate may include one or more semiconductor materials such as silicon, germanium, silicon germanium, germanium arsenide, indium arsenide, indium arsenide, indium gallium arsenide, indium antimonide, or combinations thereof. In one or more embodiments, the substrate may be a silicon substrate. In one or more embodiments, the substrate may be another suitable substrate.

In one or more embodiments, the substrate may be a bulk substrate such as a bulk mono-crystalline silicon substrate. In one or more embodiments, the substrate may, for example, comprise a layer of (110) silicon on a (100) silicon wafer. In one or more embodiments, the substrate may be a silicon-on-insulator (SOI) substrate. The SOI substrate may, for example, be formed by a SIMOX process. In one or more embodiments, the substrate may be a silicon-on-sapphire (SOS) substrate. In one or more embodiments, the substrate may be a germanium-on-insulator (GeOI) substrate.

A first dielectric layer 220 may be disposed over the substrate 210. In one or more embodiments, the first dielectric layer 220 may comprise an oxide (such as silicon dioxide $SiO_2$), a nitride (such as silicon nitride, $Si_3N_4$ or $Si_xN_y$), an oxynitride (such as silicon oxynitride, S—O—N or $SiO_xN_y$) or combinations thereof. In one or more embodiments, the first dielectric layer 220 may be in direct contact with the substrate 210.

If a layer A is disposed over (e.g. overlies) a layer B, then in one or more embodiments, it is possible that layer A may not be in direct contact with layer B. For example, it is possible that there may be one or more other layers between layer A and layer B. If a layer A is disposed over (e.g. overlies)

a layer B, then in one or more embodiments, it is possible that layer A may be in direct contact with layer B.

In one or more embodiments, the first dielectric layer may comprise a single layer or it may comprise two or more layers of different materials. For example, the first dielectric layer 220 may comprise an oxide/nitride stack such as a $SiO_2/Si_xN_y$ stack. In one embodiment, a nitride layer may be over an oxide layer. In another embodiment, an oxide layer may be over a nitride layer. The first dielectric layer may comprise an oxide/nitride/oxide stack (for example, an ONO stack).

In one or more embodiments, the first dielectric layer 220 may comprise a high-k dielectric material. The high-k material may have a dielectric constant greater than about 3.9. The high-k material may have a dielectric constant greater than silicon dioxide. The high-k material may comprise a hafnium-based material. The high-k material may comprise one or more of the elements Hf, Al, Si, Zr, O, N, Ta, La, Ti, Y, Pr, Gd and combinations thereof. The high-k material may comprise HfSiON, HfSiO, $HfO_2$, $HfSiO_x$, $HfAlO_x$, $HfAlO_xN_y$, $HfSiAlO_x$, $HfSiAlO_xN_y$, $Al_2O_3$, $ZrO_2$, $ZrSiO_x$, $Ta_2O_5$, $SrTiO_3$, $La_2O_3$, $Y_2O_3$, $Gd_2O_3$, $Pr_2O_3$, $TiO_2$, $ZrAlO_x$, $ZrAlO_xN_y$, $SiAO_x$, $SiAlO_xN_y$, $ZrSiAlO_x$, $ZrSiAlO_xN_y$, or combinations thereof. The high-k material may comprise $Al_2O_3$. In one or more embodiments, the first dielectric layer 220 may comprise any other dielectric material or high-k dielectric material. In one or more embodiments, the first dielectric layer 220 may comprise an oxide/high-k stack such as a $SiO_2/Al_2O_3$ stack.

In one or more embodiments, the first dielectric layer may have a thickness of about 15 nm or less. In one or more embodiments, the first dielectric layer may have a thickness of about 12 nm or less. In one or more embodiments, the first dielectric layer may have a thickness of about 10 nm or less. In one or more embodiments, the first dielectric layer may have a thickness of about 5 nm or greater. In one or more embodiments, the first dielectric layer may have a thickness of about 7 nm or greater. In one or more embodiments, the first dielectric layer may have a thickness between about 12 nm and about 5 nm. In one or more embodiments, the first dielectric layer may have a thickness between about 10 nm and about 7 nm. In one or more embodiments, the first dielectric layer may be about 8.5 nm. The first dielectric layer is not limited to any particular thickness.

The first dielectric layer 220 may be formed in many different ways. For example, the first dielectric layer 220 may be grown by a thermal oxidation, deposited by a chemical vapor deposition (CVD), atomic layer deposition (ALD), physical vapor deposition (PVD), or a jet vapor deposition. Hence, the first dielectric layer 220 may be formed by a growth process or by a deposition process.

A high-k material may be formed, for example, by a deposition process. Examples of deposition processes which may be used include chemical vapor deposition (CVD), physical vapor deposition (PVD), atomic layer deposition (ALD), molecular beam epitaxy (MDE), or other deposition processes. In one or more embodiments, the first dielectric layer 220 may serve as a tunneling dielectric layer for a floating gate memory device.

A floating gate 230 may be disposed over the first dielectric layer 220. In one or more embodiments, the floating gate 230 may be in direct contact with the first dielectric layer 220. In one or more embodiments, the floating gate 230 may comprise any conductive material.

In one or more embodiments, the floating gate 230 may comprise, for example, a polysilicon material. The polysilicon material may be a doped polysilicon. The polysilicon may be doped with an n-type dopant (such as phosphorus) or a p-type dopant (such as boron). The doping may be accomplished using an ion implantation process or it may be done in-situ. In one or more embodiments, the polysilicon may be heavily doped.

In one or more embodiments, the floating gate 230 may comprise a metallic material such as a pure metal or a metal alloy. In one or more embodiments, the floating gate 230 may comprise a metal silicide or a metal nitride.

In one or more embodiments, the floating gate 230 may comprise a conductive material. In one or more embodiments, the floating gate 230 may comprise a semiconductor material. In one or more embodiments, it is possible that the floating gate 230 may comprise a dielectric material.

In one or more embodiments, the floating gate 230 may comprise at least one of Ti, Ta, TiN, TiC, HfN, TaC, TaN, W, Al, Ru, RuTa, TaSiN, NiSix, CoSix, $TiSi_x$, Ir, Y, Pt, I, Pt, Pd, Re, Rh, borides of Ti, borides of Hf, borides of Zr, phosphides of Ti, phosphides of Hf, phosphides of Zr, antimonides of Ti, antimonides of Hf, antimonides of Zr, TiAlN, Mo, MoN, ZrSiN, ZrN, HfN, HfSiN, WN, Ni, Pr, VN, TiW, and/or combinations thereof.

In one or more embodiments, the floating gate 230 may comprise a nitride. In one or more embodiments, the floating gate 230 may comprise a nanocrystalline material. In one or more embodiments, the floating gate 230 may comprises a high-k dielectric material.

The floating gate 230 may comprise a single layer or a plurality of stacked layers (such as a polysilicon layer disposed over a metal layer). Likewise, the floating gate 230 may comprise a composite of two or more materials. The floating gate 230 may be formed in many different ways. Examples include chemical vapor deposition, physical vapor deposition and atomic layer deposition. In one or more embodiments, the floating gate 230 may comprise a mixture (such as a heterogeneous mixture or a homogeneous mixture) of two or more different materials.

The floating gate 230 may be a three-dimensional structure. In one or more embodiments, the floating gate may have the shape of a cuboid (such as a rectangular cuboid) such that the cross-sections in an X-Z plane, a Y-Z and an X-Y plane are all substantially rectangular. However, the floating gate 230 is not limited to this shape and other shapes are possible.

In one or more embodiments, it is possible that the top surface 232 of the floating gate 230 be, for example, rounded, arched or dome shaped. Hence, it is possible that the cross-section of the top surface 232 (in either an X-Z plane and/or a Y-Z plane) have a rounded, arched or dome shaped. In one or more embodiments, it is also possible that the cross section of the floating gate 230 in an X-Z plane and/or a Y-Z plane be omega shaped.

In other embodiments, the floating gate may also have three-dimensional shapes such as conical, frusto-conical, pyramidal, frusto-pyramidal, hemispherical, and frusto-hemispherical. In one or more embodiments, the cross section of the floating gate in an X-Y plane may, for example, be circular, oval, rectangular or square.

In one or more embodiments, the floating gate may be in the shape of a fin or in the shape of a pillar. In one or more embodiments, the fin or the pillar may be omega shaped. For example, the cross-section of the fin or the pillar in an X-Z plane and/or a Y-Z plane may be omega shaped.

In one or more embodiments, the floating gate 230 may have a height H, a length L and a width W. The height H may be the maximum dimension of the floating gate in the Z-direction. This may be the direction perpendicular to the substrate.

The length L may be the maximum lateral dimension of the floating gate in a direction which is parallel to the channel length of the floating gate device. Referring to FIG. 1A, the channel length CL may be a dimension of the channel region between the two source/drain extension regions 310. In the embodiment shown in FIGS. 1A, 1B or the embodiment shown in FIGS. 2A, 2B, the channel length CL as well as the length L of the floating gate 230 are in the X-direction.

In the embodiments shown, for example in FIG. 1A and FIG. 2A, the length L of the floating gate 230 may be substantially the same as the channel length CL. However, in another embodiment, the length L may be greater than the channel length CL. Likewise, in another embodiment, the length L may be less than the channel length CL.

The width W of the floating gate 230 may be the maximum dimension of the floating gate in the direction perpendicular to the channel length CL of the floating gate device. In the embodiments shown in FIGS. 1A, 1B and FIGS. 2A, 2B, the width W of the floating gate 230 is in the Y-direction.

In one or more embodiments, the width W of the floating gate may greater than the length L of the floating gate. In one or more embodiments, the width W of the floating gate may be less than the length L of the floating gate. In one or more embodiments, the width W of the floating gate may be substantially the same as the length L of the floating gate.

In one or more embodiments, the floating gate may have an aspect ratio such that the height H is substantially the same as the length L. In one or more embodiments, the floating gate may have an aspect ratio such that the height H is greater than the length L. In one or more embodiments, the height H of the floating gate may be greater than or equal to about 2 times the length L. In one or more embodiments, the height H of the floating gate may be greater than or equal to about 5 times the length L. In one or more embodiments, the height H of the floating gate may be greater than or equal to about 10 times the length L.

In one or more embodiments, the floating gate may have an aspect ratio such that the height H is substantially the same as the width. In one or more embodiments, the floating gate may have an aspect ratio such that the height H is greater than the width W. In one or more embodiments, the height H of the floating gate may be greater than or equal to about 2 times the width W. In one or more embodiments, the height H of the floating gate may be greater than or equal to about 5 times the width W. In one or more embodiments, the height H of the floating gate may be greater than or equal to about 10 times the width W.

In one or more embodiments, the floating gate may have an aspect ratio such that the height H is greater than the smaller of the length L and the width W. In one or more embodiments, the floating gate may have an aspect ratio such that the height H is greater than or equal to about 2 times the smaller of the length L and the width W. In one or more embodiments, the floating gate may have an aspect ratio such that the height H is greater than or equal to about 5 times the smaller of the length L and the width W. In one or more embodiments, the floating gate may have an aspect ratio such that the height H is greater than or equal to about 10 times the smaller of the length L and the width W.

In one or more embodiments, the floating gate may have an aspect ratio such that the height H is greater than the larger of the length L and the width W. In one or more embodiments, the floating gate may have an aspect ratio such that the height H is greater than or equal to about 2 times the larger of the length L and the width W. In one or more embodiments, the floating gate may have an aspect ratio such that the height H is greater than or equal to about 5 times the larger of the length L and the width W. In one or more embodiments, the floating gate may have an aspect ratio such that the height H is greater than or equal to about 10 times the larger of the length L and the width W.

In one or more embodiments, it is possible that the length L of the floating gate 230 has a dimension which is sublithographic (e.g. smaller than that which can be made by lithography). In one or more embodiments, it is possible that the width W of the floating gate 230 has a dimension which is sublithograhic.

In one or more embodiments, it is possible that the length L of the floating gate 230 has a dimension which is about 150 nanometers or less. In one or more embodiments, it is possible that the length L of the floating gate 230 has a dimension which is about 120 nanometers or less. In one or more embodiments, it is possible that the length L of the floating gate 230 has a dimension which is about 100 nanometers or less. In one or more embodiments, it is possible that the length L of the floating gate 230 has a dimension which is about 75 nanometers or less. In one or more embodiments, it is possible that the length L of the floating gate 230 has a dimension which is about 50 nanometers or less. In one or more embodiments, it is possible that the length L of the floating gate 230 has a dimension which is about 30 nanometers or less. In one or more embodiments, the length L of the floating gate 230 may be about 50 nm. It is noted that the length L of the floating gate 230 is not limited to any particular length.

In one or more embodiments, it is possible that the width W of the floating gate 230 has a dimension which is sublithograhic. In one or more embodiments, it is possible that the width W of the floating gate 230 has a dimension of about 150 nanometers or less. In one or more embodiments, it is possible that the width W of the floating gate 230 has a dimension of about 120 nanometers or less. In one or more embodiments, it is possible that the width W of the floating gate 230 has a dimension of about 100 nanometers or less. In one or more embodiments, the width W of the floating gate may be about 75 nanometers or less. In one or more embodiments, it is possible that the width W of the floating gate 230 has a dimension which is about 50 nanometers or less. In one or more embodiments, it is possible that the width W of the floating gate 230 has a dimension which is about 30 nanometers or less. In one or more embodiments, the width W of the floating gate 230 may be about 50 nm. It is noted that the width W of the floating gate 230 is not limited to any particular width.

In one or more embodiments, it is possible that the height H of the floating gate 230 has a dimension about 30 nm (nanometers) or greater. In one or more embodiments, it is possible that the height H of the floating gate 230 has a dimension about 50 nm or greater. In one or more embodiments, it is possible that the height H of the floating gate 230 has a dimension about 75 nm or greater. In one or more embodiments, the height H of the floating gate 230 may be about 100 nm or greater. In one or more embodiments, it is possible that the height H of the floating gate 230 has a dimension which is about 120 nm or greater. In one or more embodiments, it is possible that the height H of the floating gate 230 has a dimension which is about 150 nm or greater. In one or more embodiments, it is possible that the height H of the floating gate 230 has a dimension which is about 200 nm or greater. In one or more embodiments, it is possible that the height H of the floating gate 230 has a dimension which is about 300 nm or greater. In one or more embodiments, it is possible that the height H of the floating gate 230 has a dimension which is about 500 nm or greater. In one or more embodiments, it is possible that the height H of the floating gate 230 has a dimension which is about 1000 nm or greater. In one or more embodiments, the height H of the floating gate 230 may be about 100 nm. It is noted that the height H of the floating gate 230 is not limited to any particular height.

Referring to FIGS. 1A-D or to FIGS. 2A-D the embodiments of the floating gate 230 shown includes a top surface 232 and four sidewall surfaces 234, 236. Two opposite sidewall surfaces 234 may be substantially perpendicular to an X-Z plane (and parallel to a Y-Z plane). The sidewalls surfaces 234 may be substantially parallel to the width W and substantially perpendicular to the length L (or to the channel length CL). Two opposite sidewall surfaces 236 may be substantially perpendicular to a Y-Z plane (and parallel to an X-Z plane). The sidewall surfaces 236 may be substantially parallel to the length L (or to the channel length CL) and substantially perpendicular to the width W.

In the embodiments shown in FIGS. 1A-D as well as 2A-D, the cross-section of the floating gate 230 in the X-Z plane as well as the cross section in a Y-Z plane may be substantially rectangular. However, in other embodiments, the cross-section of the floating gate in an X-Z plane and/or the cross section in a Y-Z plane may have other shapes. For example, the cross section of the top surface 232 in an X-Z plane and/or in a Y-Z plane may be rounded, arched or dome shaped. In addition, for example, the cross section of the floating gate in the X-Z plane and/or the cross section in a Y-Z plane may be omega-shaped.

In one or more embodiments, the sidewall surfaces 234 may be the major sidewall surfaces while the sidewall surfaces 236 may be the minor sidewall surfaces so that the surface areas of the sidewall surfaces 234 may be greater than the surface areas of the sidewall surfaces 236. In this case, the width W of the floating gate 230 may be greater than the length L of the floating gate 230.

In one or more embodiments, it is possible that the sidewall surfaces 236 may be the major sidewall surfaces while the sidewall surfaces 234 may be the minor sidewall surfaces so that the surface areas of the sidewall surfaces 236 may be greater than the surface areas of the sidewall surfaces 234. In this case, the width W of the floating gate 230 may be less than the length L of the floating gate 230.

In one or more embodiments, the sidewall surfaces 234 may have substantially the same surface areas as the sidewall surfaces 236. In this case, it is possible that the width W may be substantially the same as the length L.

In one or more embodiments, the floating gate may have one or more sidewall surfaces. In one or more embodiments, the floating gate may have two or more sidewall surfaces. In one or more embodiments, the floating gate may have three or more sidewall surfaces. In one or more embodiments, the floating gate may have four or more sidewall surfaces. In one or more embodiments, one or more of the sidewall surfaces may be substantially perpendicular relative to the substrate. In one or more embodiments, one or more of the sidewall surfaces may be tilted relative to the substrate.

Referring to FIGS. 1A-D and to FIGS. 2A-D, after the formation of the floating gate 230, a second dielectric layer 240 may be formed over the floating gate 230. Referring to FIGS. 2A,2B, it is seen that, in one or more embodiments, dielectric blocks 290 may be formed before the formation of second dielectric layer 240 so that the second dielectric layer 240 may be formed over the dielectric blocks 290.

Referring to the embodiment shown in FIGS. 1A-D, in one or more embodiments, the second dielectric layer 240 may be formed over all of the top surface 232 of the floating gate as well as over all of each of the sidewall surfaces 234 and 236 of the floating gate 230.

In one or more embodiments, the second dielectric layer 240 may be formed over substantially all of the top surface 232 of the floating gate. In one or more embodiments, the second dielectric layer 240 may be formed over at least a portion of the top surface 232 of the floating gate. In one or more embodiments, the second dielectric layer 240 may be formed over substantially all of each of the sidewall surfaces 234 and 236 of the floating gate 230. In one or more embodiments, the second dielectric layer 240 may be in direct contact with the floating gate 230.

As noted above, FIG. 1C represents a cross section of the device 110 in an X-Y plane through the cross section A-A (as shown in FIG. 1A). FIG. 1C is simplified so as not to show layer 260 or layer 270. FIG. 1C shows that, in one or more embodiments, the second dielectric layer 240 may laterally surround the entire vertical dimension (e.g. height dimension) of the floating gate. As shown in FIG. 1C, in one or more embodiments, the second dielectric layer 240 may go completely all the way around substantially the entire vertical dimension (e.g. height dimension) of the floating gate.

In one or more embodiments, the second dielectric layer 240 may substantially laterally surround the entire vertical dimension of the floating gate 230. In one or more embodiments, the second dielectric layer 240 may substantially laterally surround substantially the entire vertical dimension of the floating gate 230.

Referring to the embodiment shown in FIGS. 2A-D, it is seen that, in one or more embodiments, the second dielectric layer 240 may be formed over all of the top surface 232 of the floating gate 230 as well as over only a portion (such as an upper portion) of each of the sidewall surfaces 234, 236. An example of an upper portion is an upper portion P1 shown in FIGS. 2A,2B.

Hence, in one or more embodiments, it is possible that the second dielectric layer may be formed over at least a portion of each of the sidewall surfaces (such as sidewall surfaces 234, 236) of the floating gate. The portion may be an upper portion or any other portion of each of the sidewall surfaces. In one or more embodiments, it is possible that the second dielectric layer may be formed over at least a portion (an upper portion or any other portion) of at least one of or each of the sidewall surfaces 234 without be formed over the sidewall surfaces 236.

In one or more embodiments, the second dielectric layer 240 may be formed over substantially all of the top surface 232 of the floating gate 230. In one or more embodiments, the second dielectric layer 240 may be formed over at least a portion of the top surface 232 of the floating gate 230.

As noted above, FIG. 2C represents a cross section of the device 120 from FIGS. 2A,2B through the cross section A-A (FIG. 2C is simplified so as not to show layer 260 or layer 270). FIG. 2C shows that, in one or more embodiments, the second dielectric layer 240 may laterally surround a portion of the vertical dimension (e.g. height dimension) of the floating gate. As shown in FIG. 2C, in one or more embodiments, the second dielectric layer 240 may go completely all the way around a portion of the vertical dimension of the floating gate. The portion may be an upper portion (such as upper portion P1 shown in FIGS. 2A, 2B). In one or more embodiments, the second dielectric layer may substantially laterally surround a portion (such as an upper portion) of the floating gate.

Hence, in one or more embodiments, the second dielectric layer may overlie or cover at least a portion of the top surface and at least a portion of at least one of (or each of) the sidewall surfaces of the floating gate. In one or more embodiments, the second dielectric layer may overlie or cover substantially all of the top surface of the floating gate. In one or more embodiments, the second dielectric layer may overlie or cover all of the top surface of the floating gate. In one or more embodiments, the second dielectric layer may overlie or cover substantially all of at least one of (or each of) the sidewall surfaces of the floating gate. In one or more embodiments, the second dielectric layer may overlie or cover all of at least one of (or each of) the sidewall surfaces of the floating gate.

In one or more embodiments, the second dielectric layer 240 may be formed by a deposition process. The deposition process may be a substantially conformal deposition. In one or more embodiments, the second dielectric layer 240 may be formed by a growth process. In one or more embodiments, the second dielectric layer 240 may comprise an oxide (such as silicon dioxide $SiO_2$), a nitride (such as $Si_3N_4$ or $Si_xN_y$) an oxynitride (such as silicon oxynitride, S—O—N or $SiO_xN_y$), or combinations thereof. In one or more embodiments, the second dielectric layer may be a single layer of material. In one or more embodiments, the second dielectric layer 240 may comprise a stack of two or more layers (or a stack of three or more layers) such as an oxide/nitride stack (such as a $SiO_2/Si_3N_4$ or a $SiO_2/Si_xN_y$ stack). In one embodiment, a nitride layer may be over an oxide layer. In another embodiment, an oxide layer may be over nitride layer. In one or more embodiments, the second dielectric layer 240 may comprise an oxide/nitride/oxide stack (for example, an ONO stack) or combinations thereof.

In one or more embodiments, the second dielectric layer 240 may comprise a high-k dielectric material. The high-k material may have a dielectric constant greater than about 3.9. The high-k material may have a dielectric constant greater than silicon dioxide. The high-k material may comprise a hafnium-based material. The high-k material may comprise one or more of the elements Hf, Al, Si, Zr, O, N, Ta, La, Ti, Y, Pr, Gd and combinations thereof. The high-k material may comprise HfSiON, HfSiO, $HfO_2$, $HfSiO_x$, $HfAlO_x$, $HfAlO_xN_y$, $HfSiAlO_x$, $HfSiAlO_xN_y$, $Al_2O_3$, $ZrO_2$, $ZrSiO_x$, $Ta_2O_5$, $SrTiO_3$, $La_2O_3$, $Y_2O_3$, $Gd_2O_3$, $Pr_2O_3$, $TiO_2$, $ZrAlO_x$, $ZrAlO_xN_y$, $SiAlO_x$, $SiAlO_xN_y$, $ZrSiAlO_x$, $ZrSiAlO_xN_y$, or combinations thereof. The high-k material may comprise $Al_2O_3$. Alternatively, the second dielectric layer 240 may comprise any other dielectric material or high-k dielectric material.

In one or more embodiments, the second dielectric layer 240 may have a thickness of about 20 nm (nanometers) or less. In one or more embodiments, the thickness may be about 15 nm or less. In one or more embodiments, the second dielectric layer 240 may have a thickness of about 12 nm or less. In one or more embodiments, the second dielectric layer 240 may have a thickness of about 10 nm or less. In one or more embodiments, the second dielectric layer may have a thickness of about 8 nm or less. In one or more embodiments, the thickness may be about 4 nm or greater. In one or more embodiments, the thickness may be about 6 nm or greater. In one or more embodiments, the thickness may be about 8 nm or greater. In one or more embodiments, the thickness of the second dielectric layer 240 may be about 10 nm. It is noted that the thickness of the second dielectric layer 240 is not limited to any particular thickness.

In one or more embodiments, the second dielectric layer 240 may serve as an inter-gate dielectric layer between the floating gate 230 and the control gate 250 of a floating gate memory device. In one or more embodiments, the floating gate and the control gate may both be formed of a polysilicon material (for example, each may comprise or consist essentially of doped polysilicon). In this case, the second dielectric layer 240 may serve as an inter-poly dielectric layer.

As shown in FIGS. 1A and 2A, the semiconductor devices 110 and 120 may each include source/drain extension regions 310. In one or more embodiments, it is possible that the extension regions 310 may be formed before the formation of second dielectric layer 240. For example, it is possible that the extensions 310 be formed after the formation of the floating gate 230 and before the formation of the second dielectric layer 240.

In one or more embodiments, the source/drain extension regions 310 may be formed after the formation of the second dielectric layer 240. For example, the extension regions 310 may be formed after the formation of the second dielectric layer 240 but before the formation of the control gate 250.

In one or more embodiments, it is possible that the source/drain extensions 310 be formed after the formation of the control gate 250 but before the formation of layer 260. In one or more embodiments, it is possible that the source/drain extensions be formed after the formation of layer 260.

The source/drain extension regions 310 may be formed by an ion implantation process. The source/drain extension regions 310 may, for example, be lightly doped drain (LDD) regions. In one or more embodiments, the source/drain extension regions 310 may, for example, be medium doped drain (MDD) regions. In one or more embodiments, the extension regions 310 may be n-type. In one or more embodiments, the extension regions 310 may be p-type. A channel region may exist in the substrate between the two source/drain extension regions 310.

A control gate 250 may be disposed over the second dielectric layer 240. Referring to the embodiments shown in FIGS. 1A-D and FIGS. 2A-D, it is seen that the second dielectric layer 240 includes a top surface 242 as well as sidewall surfaces 244 and 246. The control gate 250 may be formed over all of the top surface 242 of the second dielectric layer 240 as well as over all each of the sidewall surfaces 244 and 246 of the second dielectric layer 240.

In one or more embodiments, the control gate 250 may be formed over substantially all of the top surface 242 of the second dielectric layer 240. In one or more embodiments, the control gate 250 may be formed over at least a portion of the top surface 242 of the second dielectric layer 240. In one or more embodiments, control gate may be formed over substantially all of each of the sidewall surfaces 244 and 246 of the second dielectric layer 240. In one or more embodiments, control gate may be formed over at least a portion of each of the sidewall surfaces 244 and 246 of the second dielectric layer 240. In one or more embodiments, the control gate 250 may be formed in direct contact with the second dielectric layer 240.

Referring to FIG. 1C or FIG. 2C, it is seen that the control gate 250 may laterally surround that portion of the second dielectric layer 240 that is over the sidewalls of the floating gate 230. Referring to FIG. 1C, in one or more embodiments, the control gate 250 may completely go all the way around that portion of the second dielectric layer is over the sidewall surfaces of the floating gate 230.

In one or more embodiments, the control gate may substantially laterally surround that portion of the second dielectric layer that is over the sidewall surfaces of the floating gate 230.

In one or more embodiments, it is possible that the control gate 250 be formed over at least one of the sidewall surfaces of the second dielectric layer 240. In one or more embodiments, it is possible that the control gate 250 be formed over at least a portion of each of the sidewall surfaces (such as sidewall surfaces 244, 246) of the second dielectric layer 240. The portion may be an upper portion or any other portion of each of the sidewall surfaces. In one or more embodiments, it is possible that the control gate 250 be formed over at least a portion of the sidewall surfaces 244 without be formed over the sidewall surfaces 246.

In one or more embodiments, it is possible that the control gate 250 may be formed over only a portion of the sidewall surfaces of the second dielectric layer. In one or more embodiments, the control gate may not be formed over the entire second dielectric layer. In one or more embodiments, the control gate 250 may not laterally surround the second dielectric layer.

In one or more embodiments, the control gate 250 may serve as a control gate for a floating gate memory device.

In one or more embodiments, the control gate 250 may be formed of any conductive material. Hence, in one or more embodiments, the control gate 250 may comprise any conductive material.

In one or more embodiments, the control gate 250 may comprise, for example, a polysilicon material. In one or more embodiments, the polysilicon material may be a doped polysilicon. The polysilicon may be doped with an n-type dopant (such as phosphorus) or a p-type dopant (such as boron). The doping may be accomplished using an ion implantation process or be done in-situ. In one or more embodiments, the polysilicon may be heavily doped. In one or more embodiments, the polysilicon material used for the control gate may be the same as that used for the floating gate. In one or more embodiments, the polysilicon material used for the control gate may be different from the polysilicon material used for the floating gate.

In one or more embodiments, doping of the control gate 250 may be at least partially accomplished during the formation of the source/drain extensions and/or the source/drain regions.

In one or more embodiments, the control gate 250 may comprise a metallic material such as a pure metal or a metal alloy. In one or more embodiments, the control gate may be any other material suitable as a control gate for a charge storage memory device such as a floating gate memory device. In one or more embodiments, the control gate 250 may comprise a metal silicide or a metal nitride.

In one or more embodiments, the control gate layer 270 may comprise one or more of Ti, Ta, TiN, TiC, HfN, TaN, TaC, TaN, W, Al, Ru, RuTa, TaSiN, NiSix, CoSix, TiSix, Ir, Y, Pt, I, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, other metals, and/or combinations thereof.

In one or more embodiments, the control gate 250 may comprise a single layer. In one or more embodiments, the control gate 250 may comprise a plurality of stacked layers. In one or more embodiments, the control gate 250 may comprise a metallic layer (such as a pure metal or metal alloy) over a doped polysilicon layer. In one or more embodiments, the control gate 250 may comprise a metal silicide layer. In one or more embodiment, the control gate 250 may comprise a metal nitride layer over a doped polysilicon layer.

The control gate 250 may comprise a mixture (such as a heterogeneous mixture) of two or more different materials.

In one or more embodiments, the thickness of the control gate 250 may be about 30 nanometers or less. In one or more embodiments, the thickness of the control gate 250 may be about 20 nm or less. In one or more embodiments, the thickness of the control gate 250 may be about 15 nm or less. In one or more embodiments, the thickness of the control gate 250 may be about 10 nm or less. In one or more embodiments, the thickness of the control gate 250 may be about 5 nm or less. In one or more embodiments, the thickness of the control gate 250 may be about 3 nm or more. In one or more embodiments, the thickness of the control gate 250 may be about 5 nm or more. In one or more embodiments, the control gate 250 may have a thickness of about 10 nm. Other thicknesses are also possible and the thickness of the control gate 250 is not limited to any particular thickness.

The control gate 250 may be deposited in many different ways. Examples include chemical vapor deposition, physical vapor deposition and atomic layer deposition. In one or more embodiments, the control gate may be formed by a conformal deposition of the control gate material. The deposition may be followed by an etch to remove the control gate material from undesired locations. In one or more embodiments, the etch may be include a dry etch.

Referring to the embodiments shown in FIGS. 1A,1B and 2A,2B, after the formation of the control gate 250, the layers 260, 270 may be formed over the sidewalls of the control gate 250. In one or more embodiments, the layers 260, 270 may be formed of dielectric materials. Examples of dielectric materials include, but not limited to, oxides, nitrides, oxynitrides and mixtures thereof. In one or more embodiments, the layer 260 may comprise a first dielectric material while the layer 270 may comprise a second dielectric material different from the first dielectric material. In one example, the layer 260 may comprise an oxide while layer 20 may comprise a nitride. In another example, the layer 260 may comprise a nitride while the layer 270 may comprise an oxide.

The layer 260 and/or the layer 270 may be formed as sidewall spacers. In one or more embodiments, the layer 260 may be formed as a liner while the layer 270 may be formed as a spacer. In one or more embodiments, the layers 260, 270 may be formed as a dual layered spacer.

The memory device 110 shown in FIGS. 1A,1B as well as the memory device 120 shown in FIGS. 2A,2B may include source/drain regions 320. In one or more embodiments, the source/drain regions 320 may be formed after the formation of the layer 270. Hence, the layer 270 and/or the layer 260 may be used to position the source/drain regions. For example, after the formation of the layers 260, 270, another ion implantation step may be performed to form the source/drain regions 320.

In one or more embodiments, the source/drain regions 320 may be of the same conductivity type as the source/drain extensions 310. In one or more embodiments, the source/drain regions 320 may be more heavily doped than the source/drain extensions 310. In one or more embodiments, the source/drain regions 320 may be formed as heavily doped drain (HDD) regions. In one or more embodiments, the depth of the source/drain regions 320 may be greater than the depth of the extension regions 310.

In one or more embodiments, the ion implantation step used to form the source/drain extensions 310 may also serve to dope the control gate 250 with either n-type or p-type dopants. Likewise, in one or more embodiments, the ion implantation step used to form the source/drain regions 320 may be used to dope the control gate 250 with n-type or p-type dopants.

Referring to the embodiments shown in FIGS. 1A, 1B as well as in FIGS. 2A, 2B, an electrode 280 may be formed over the control gate 280. The electrode 280 may comprise any conductive material. In one or more embodiments, the electrode 280 may comprise a metallic material.

In one or more embodiments, the device 110 shown in FIGS. 1A,1B as well as the device 120 shown in FIGS. 2A,2B may each be useful as a memory device such as a floating gate memory device. In one or more embodiments, the control gate 250 and/or the floating gate 230 may, for example, be formed of a doped polysilicon or some other conductive material. In one or more embodiments, the doped polysilicon may be n-doped. In one or more embodiments, the doped polysilicon may be p-doped. In one or more embodiments, the doped polysilicon may be heavily doped. The first dielectric layer 220 may, for example, be formed of an oxide, such as silicon dioxide (which may be formed by a growth process). The second dielectric layer 240 may, for example, be formed of an oxide material or of a high-k material. In another embodiment, the second dielectric layer 240 may, for example, be formed of an oxide-nitride-oxide stack. Of course, the materials mentioned are only examples and other materials may be substituted for the materials described. In one or more embodiments, the control gate and the floating gate may each be formed of the same materials. In one or more embodiments, the control gate and the floating gate may each be formed of the different materials.

In one or more embodiments, a floating gate device may possibly be programmed by Fowler-Nordheim tunneling or by hot-carrier injection. In one or more embodiments, erasure may possibly be accomplished by UV emission or by Fowler-Nordheim tunneling. In one or more embodiments, it is possible that electrical charge may be stored on the floating gate so as to adjust the threshold voltage VT of the device. Of course, these are only examples of possible ways to operate a floating gate device and other ways may also be possible.

Referring to the embodiments shown in FIGS. 1A-D and FIGS. 2A-D the control gate 250 may be disposed over (e.g. overlies) at least a portion of the floating gate 230.

Referring to the embodiment shown in FIGS. 1A-D in one or more embodiments, the control gate 250 may be disposed over all of the top surface 232 of the floating gate as well as over all of each of the sidewall surfaces 234 and 236 of the floating gate 230.

In one or more embodiments, the control gate 250 may be disposed over substantially all of the top surface 232 of the floating gate. In one or more embodiments, the control gate 250 may be disposed of at least a portion of the top surface 232 of the floating gate. In one or more embodiments, the control gate 250 may be disposed over substantially all of each of the sidewall surfaces 234 and 236 of the floating gate 250.

FIG. 1C shows that, in or more embodiments, the control gate 250 may laterally surround the entire vertical dimension (e.g. height dimension) of the floating gate 230. In the embodiment shown, the control gate 250 may go completely all the way around the entire vertical dimension (e.g. height dimension) of the floating gate.

In one or more embodiments, the control gate 250 may laterally surround substantially the entire vertical dimension of the floating gate 230 (for example, the control gate 250 may go completely all the way around substantially the entire vertical dimension of the floating gate). In one or more embodiments, the control gate 250 may substantially laterally surround substantially the entire vertical dimension of the floating gate.

Referring to the embodiment shown in FIG. 2A-D, it is seen that the control gate 250 may be disposed over all of the top surface 232 of the floating gate 230 as well as only an upper portion (for example, an upper portion P2) of each of the sidewall surface 234, 236 of the floating gate 230.

In one or more embodiments, the control gate 250 may be disposed over substantially all of the top surface 232 of the floating gate. In one or more embodiments, the control gate 250 may be disposed of at least a portion of the top surface 232 of the floating gate.

In one or more embodiments, it is possible that the control gate be disposed over at least a portion of one or more of the sidewall surfaces (such as sidewall surfaces 234, 236) of the floating gate. In one or more embodiments, it is possible that the control gate be disposed over at least a portion of each of the sidewall surfaces (such as sidewall surfaces 234, 236) of the floating gate. The portion may be an upper portion or any other portion of each of the sidewall surfaces. In one or more embodiments, it is possible that the control gate may be disposed over at least a portion (for example, an upper portion or any other portion) of at least one of or each of the sidewall surfaces 234 without being disposed over the sidewall surfaces 236.

FIG. 2C shows that, in one or more embodiments, the control gate 250 may laterally surround a portion of the vertical dimension (e.g. height dimension) of the floating gate 230. The portion may be an upper portion (such as upper portion P2 shown in FIGS. 2A,2B). In the embodiment shown in FIG. 2C, the control gate 250 may go completely all the way around a portion (such as an upper portion P2) of the floating gate.

In one or more embodiments, the control gate 250 may substantially laterally surround a portion of the vertical dimension of the floating gate 230. The portion may be an upper portion.

Hence, in one or more embodiments the control gate 250 may laterally surround at least a portion of the vertical dimension (e.g. height dimension) of the floating gate 230. In one or more embodiments, the control gate may go completely all the way around at least a portion of the vertical dimension of the floating gate. In one or more embodiments, the control gate 250 may substantially laterally surround at least a portion of the vertical dimension (e.g. height dimension) of the floating gate. In one or more embodiments of the invention, it is possible that the control gate 250 does not go all the way around the control gate 230.

In one or more embodiments, a second dielectric layer may exist between the control gate and the floating gate.

In one or more embodiments, the control gate may overlie or cover at least a portion of the top surface of the floating gate and at least a portion (such as an upper portion) of at least one of (or each of) the sidewall surfaces of the floating gate. In one or more embodiments, the control gate may overlie or cover substantially all of the top surface of the floating gate. In one or more embodiments, the control gate may overlie or cover all of the top surface of the floating gate. In one or more embodiments, the control gate may overlie or cover substantially all of each of the sidewall surfaces of the control gate. In one or more embodiments, the control gate may overlie or cover all of each of the sidewall surfaces of the control gate.

In one or more embodiments, the control gate may overlie or cover substantially all of the floating gate. In one or more embodiments, the control gate may overlie or cover all of the floating gate.

FIGS. 1A and 2A show conductive contact plugs 410 disposed over the source/drain regions 320. FIG. 1C shows a cross section of the contact plugs 410 from FIG. 1A in an X-Y plane. Likewise, FIG. 2C shows a cross section of the contact plugs 410 from FIG. 2A in an X-Y plane. Each of the contact plugs 410 faces one of the two opposite sidewall surfaces 234 of the floating gate 230.

The contact plugs may comprise any conductive material. In one or more embodiments, the contact plugs may comprise a metallic material. For example, the contacts plugs may comprise a pure metal and/or a metal alloy. Examples include pure tungsten, tungsten alloy, pure aluminum, aluminum alloy, pure copper, copper alloy or combinations thereof.

In one or more embodiments, the contact plugs 410 may be used to electrically couple the source/drain regions 320 to conductive lines situated in a first metallization level of the same semiconductor chip that includes the floating gate device. The ongoing scaling of non-volatile memory devices based on the floating gate concept may increase the parasitic capacitance between the floating gate 230 and the neighboring contact plugs 410.

The embodiments shown in FIGS. 1A-D and FIGS. 2A-D show that the control gate 250 may help to at least partially shield the floating gate 230 from the conductive contact plugs 410. In particular, that portion of the control gate 250 which overlies or covers at least a portion of the sidewall surfaces 234 may help to at least partially shield the floating gate 230 from the conductive contact plugs 410. In one or more embodiments, that portion of the control gate 250 which overlies or covers at least a portion of the sidewall surfaces 234 may be situated between the conductive contact plugs 410 and the floating gate, and provide shielding of the floating gate from the conductive plugs. The shielding may help to reduce the parasitic coupling between the floating gate 230 and the contact plugs 410.

Hence, in one or more embodiments, the control gate 250 may be disposed over at least a portion of one or both the of the sidewall surfaces 234 (which may be facing the conductive plugs 410) without also be disposed over the sidewall surfaces 236. In another embodiment, the control gate 250 may also be disposed over at least a portion of one or both of the sidewall surfaces 236.

The surface area of the control gate relative to that of the footprint (e.g. projection onto the substrate) of the floating gate may be increased by changing the aspect ratio of the floating gate. In one or more embodiments, it is possible that this may be used to adjust programming and erase voltages.

Referring to FIGS. 1A-D and FIGS. 2A-D, in one or more embodiments, the floating gate 230 may include a surface portion which may be adjacent to or in direct contact with the first dielectric layer 220. This surface portion may include, for example, the bottom surface of the floating gate 230. The surface area of this surface portion of the floating gate may be referred to as SA1.

In one or more embodiments, the floating gate 230 may include a surface portion which may be adjacent to or in direct contact with the second dielectric layer 240. This surface portion may include, for example, the top surface 232 of the floating gate 230 as well as at least a portion of one or more of (or each of) the sidewall surfaces 234, 236 of the floating gate 230. The surface area of this surface portion of the floating gate may be referred to as SA2. The ratio SA2/SA1 is referred to herein as the area factor AF.

In one or more embodiments, the first dielectric layer, the second dielectric layer and the floating gate may be arranged to provide an area factor AF (the ratio SA2/SA1). Some examples of possible area factors AF are as follows: In some embodiments, AF>1; in some embodiments, AF≥about 2; in some embodiments, AF≥about 5; in some embodiments, AF≥about 7; in some embodiments, AF≥about 9; in some embodiments, AF≥about 10; in some embodiments, AF≥about 13; in some embodiments, AF≥about 15; in some embodiments, AF≥about 17; in some embodiments, AF≥about 20; in some embodiments, AF≥about 21; in some embodiments, AF≥about 25; in some embodiments, AF≥about 29. Other examples are possible and the present invention is not limited to the examples provided.

In one or more embodiments, the floating gate may have a footprint FP (e.g. a projection onto the substrate). Some examples of possible footprints are as follows: In some embodiments, FP≤about 10000 square nanometers; in some embodiments, FP≤about 7500 square nanometers; in some embodiments, FP≤about 4900 square nanometers; in some embodiments, FP≤about 3000 square nanometers; in some embodiments, FP≤about 2500 square nanometers; in some embodiments, FP≤about 2000 square nanometers; in some embodiments, FP≤about 16000 square nanometers; in some embodiments, FP≤about 1500 square nanometers; in some embodiments, FP≤about 900 square nanometers. Other examples are also possible and the present invention is not limited to the examples provided.

There are many possible combinations of area factors AF (the ratio SA2/SA1) and floating gate footprints FP which may possibly be achieved for a floating gate device of the present invention. Some examples are as follows: In some embodiments, AF≤about 5 and FP≤about 10000 square nanometers; in some embodiments, AF≤about 5 and FP≤about 7500 square nanometers; in some embodiments, AF≥about 5 and FP≤about 4900 square nanometers; in some embodiments, AF≥about 5 and FP≤about 3000 square nanometers; in some embodiments, AF≥about 5 and FP≤about 2500 square nanometers, in some embodiments, AF≥about 5 and FP≤about 2000 square nanometers; in some embodiments, AF≥about 5 and FP≤about 1600 square nanometers; in some embodiments, AF≥about 9 and FP≤about 900 square nanometers.

Additional examples of possible combinations of area factors AF and floating gate footprints FP are the following: In some embodiments, AF≥about 9 and FP≤about 10000 square nanometers; in some embodiments, AF≥about 9 and FP≤about 7500 square nanometers; in some embodiments, AF≥about 9 and FP≤about 4900 square nanometers; in some embodiments, AF≥about 9 and FP≤about 3000 square nanometers; in some embodiments, AF≥about 9 and FP≤about 2500 square nanometers, in some embodiments, AF≥about 9 and FP≤about 2000 square nanometers; in some embodiments, AF≥about 9 and FP≤about 1600 square nanometers; in some embodiments, AF≥about 9 and FP≤about 900 square nanometers.

Additional examples of possible combinations of area factors AF and floating gate footprints FP of the device of the present invention are as follows: In some embodiments, AF≥about 13 and FP≤about 10000 square nanometers; in some embodiments, AF≥about 13 and FP≤about 7500 square nanometers; in some embodiments, AF≥about 13 and FP≤about 4900 square nanometers; in some embodiments, AF≥about 13 and FP≤about 3000 square nanometers, in some embodiments, AF≥about 13 and FP≤about 2500 square nanometers; in some embodiments, AF≥about 13 and FP≤about 2000 square nanometers; in some embodiments, AF≥about 13 and FP≤about 1600 square nanometers; in some embodiments, AF≥about 13 and FP≤about 900 square nanometers.

Additional examples of possible combinations of area factors AF and floating gate footprints FP of the device of the present invention are as follows: In some embodiments, AF≥about 17 and FP≤about 10000 square nanometers; in some embodiments, AF≥about 17 and FP≤about 7500 square nanometers; in some embodiments, AF≥about 17 and FP≤about 4900 square nanometers; in some embodiments, AF≥about 17 and FP≤about 3000 square nanometers, in some embodiments, AF≥about 17 and FP≤about 2500 square nanometers; in some embodiments, AF≥about 17 and FP≤about 2000 square nanometers; in some embodiments, AF≥about 17 and FP≤about 1600 square nanometers; in some embodiments, AF≥about 17 and FP≤about 900 square nanometers.

Additional examples of possible combinations of area factors AF and floating gate footprints FP of the device of the present invention are as follows: In some embodiments, AF≥about 21 and FP≤about 10000 square nanometers; in some embodiments, AF≥about 21 and FP≤about 7500 square nanometers; in some embodiments, AF≥about 21 and FP≤about 4900 square nanometers; in some embodiments, AF≥about 21 and FP≤about 3000 square nanometers; in some embodiments, AF≥about 21 and FP≤about 2500 square nanometers; in some embodiments, AF≥about 21 and FP≤about 2000 square nanometers; in some embodiments, AF≥about 21 and FP≤about 1600 square nanometers; in some embodiments, AF≥about 21 and FP≤about 900 square nanometers.

Of course, it is understood that other combinations are possible and that the present invention is not limited to the examples provided above.

In one or more embodiments, the floating gate memory device of the present invention (such as the embodiments shown in FIGS. 1A-D or in FIGS. 2A-D) may be stand-alone memory devices or embedded memory devices. As embedded memory device, they may be used as an embedded memory device in combination with at least one logic device on the same semiconductor chip or the same substrate. Hence, the same chip (or same substrate) may include a memory portion (with one or more memory devices) and a logic portion (with one or more logic devices).

In one or more embodiments, the floating gate memory device may be part of a semiconductor chip. In one or more embodiments, the floating gate memory device may be part of an integrated circuit. In one or more embodiments, the floating gate memory device may be part of a memory array.

Referring again to FIGS. 1A,1B or to FIGS. 2A,2B, it is noted that in one or more embodiments, the substrate 210 may comprise one or more wells.

One or more embodiments of the invention may be a floating gate memory device, comprising: a substrate; a floating gate disposed over the substrate; and a control gate substantially laterally surrounding at least a portion of the floating gate.

One or more embodiments of the invention may be a floating gate memory device, comprising: a substrate; a floating gate disposed over the substrate, the floating gate having a top surface and one or more sidewall surfaces; and a control gate disposed over at least a portion of the top surface and at least a portion of each of the sidewall surfaces.

In one or more embodiments, the floating gate may include one or more sidewall surfaces. The one or more sidewall surfaces of the floating gate may include two opposite sidewall surface oriented in a first direction and two opposite sidewall surfaces oriented in a second direction different from the first direction. In one or more embodiments, the first direction may be substantially perpendicular to the second direction.

One or more embodiments of the invention may be a floating gate memory device, comprising: a substrate; a fin floating gate disposed over the substrate; and a control gate disposed over at least a portion of the floating gate.

One or more embodiments of the invention may be a floating gate memory device, comprising: a substrate; a floating gate disposed over the substrate; and a control gate covering substantially all of the floating gate.

One or more embodiments of the invention may be may be a floating gate memory device, comprising: a first source/drain region; a second source/drain region laterally spaced apart from the first source/drain region; a channel region coupled between the first and second source/drain regions; a first conductive contact plug disposed over the source region and a second conductive contact plug disposed over the drain region; a floating gate disposed over the channel region, the floating gate having at least a first sidewall surface; and a control gate, at least a portion of the control gate disposed over at least a portion of the first sidewall surface, the control gate portion disposed between the floating gate and the first conductive plug.

One or more embodiments of the invention may be a floating gate memory device, comprising: a substrate; a first dielectric layer disposed over the substrate; a floating gate disposed over the first dielectric layer; a second dielectric layer disposed over floating gate; a control gate disposed over the second dielectric layer, wherein the floating gate has a first surface portion adjacent the first dielectric layer and a second surface portion adjacent the second dielectric layer, the ratio of the surface area of the second surface portion to the surface area of the first surface portion being greater than or equal to about 5, wherein the floating gate has a footprint less or equal to about 10000 square nanometers. In one or more embodiments, the ratio may be ratio is greater than or equal to about 9. In one or more embodiments, the footprint may be less than or equal to about 2500 square nanometers.

One or more embodiments of the invention may be a method for making a floating gate memory device, comprising: forming a floating gate over a substrate; and forming a control gate over the floating gate, the floating gate substantially laterally surrounding at least a portion of the floating gate. In one or more embodiments, the portion may be an upper portion. In one or more embodiments, the floating gate may substantially laterally surround substantially the entire floating gate.

Although the invention has been described in terms of certain embodiments, it will be obvious to those skilled in the art that many alterations and modifications may be made without departing from the invention. Accordingly, it is intended that al such alterations and modifications be included within the spirit and scope of the invention.

What is claimed is:

1. A floating gate memory device, comprising:
a semiconductor substrate;
source/drain regions disposed in the semiconductor substrate;
a floating gate disposed over the semiconductor substrate, said floating gate disposed over said semiconductor substrate, said floating gate having a floating gate height, a floating gate length, and a floating gate width, said floating gate length being in the direction of a channel length, said floating gate width being in a direction perpendicular to the channel length, said floating gate comprising four sidewalls that form major outer surfaces of the floating gate, wherein the four sidewalls comprise a first sidewall, a second sidewall facing the first sidewall, a third sidewall perpendicular to the first and the second sidewalls, and a fourth sidewall facing the third sidewall and perpendicular to the first and the second sidewalls;
a first dielectric layer between said semiconductor substrate and said floating gate;
a second dielectric layer conformally disposed over and around the floating gate so as to form outer sidewalls conforming to the first, the second, third, and the fourth sidewalls of the floating gate, the second dielectric layer substantially wrapping conformally around all the four sidewalls and covering a top surface of the floating gate and overlapping with portions of the source/drain regions; and
a control gate conformally disposed over and around said floating gate and the second dielectric layer, the footprint of said control gate extending outside the footprint of said floating gate so as to overlap with the portion of the second dielectric layer disposed over the portions of the source/drain regions, wherein the control gate substantially conformally wraps around sidewalls of the second dielectric layer and covers a top surface of the second dielectric layer, wherein the floating gate, the second dielectric layer, and the control gate are disposed symmetrically between the source/drain regions, wherein the control gate is capacitively coupled to the source/drain regions through the second dielectric layer; and a sidewall spacer disposed over and contacting sidewalls of the control gate and the second dielectric layer.

2. The memory device of claim 1, wherein said control gate substantially laterally surrounds substantially all of said floating gate.

3. The device of claim 1, wherein said floating gate and/or said control gate comprises doped polysilicon.

4. The floating gate memory device of claim 1, wherein the floating gate height is greater than 2 times the floating gate length.

5. The floating gate memory device of claim 1, wherein the floating gate height is greater than 5 times the floating gate length.

6. The floating gate memory device of claim 1, wherein said floating gate memory device comprises a channel region disposed in the semiconductor substrate, wherein the channel region is disposed at a major surface of the semiconductor substrate.

7. The memory device of claim 1, wherein said floating gate height being greater than said floating gate length.

8. The memory device of claim 1, further comprising a dielectric block disposed between the portion of the second dielectric layer and the portion of the source/drain regions, wherein the sidewall spacer is disposed on sidewalls of the dielectric block.

9. The memory device of claim 1, further comprising an electrode disposed over the control gate, wherein the sidewall spacer contacts sidewalls of the electrode.

10. A floating gate memory device, comprising:
source/drain regions disposed in a semiconductor substrate;
a first dielectric layer disposed at a major surface of the semiconductor substrate;
a floating gate disposed over the first dielectric layer, the floating gate comprising four sidewalls that form major outer surfaces of the floating gate, wherein the four sidewalls comprise a first sidewall, a second sidewall facing the first sidewall, a third sidewall perpendicular to the first and the second sidewalls, and a fourth sidewall facing the third sidewall and perpendicular to the first and the second sidewalls;
a second dielectric layer disposed over the floating gate, the second dielectric layer substantially conformally wrapping around the four sidewalls and covering a top surface of the floating gate and overlapping with a portion of the source/drain regions so as to form outer sidewalls conforming to the first, the second, third, and the fourth sidewalls of the floating gate, wherein the second dielectric layer contacts the source/drain regions; and
a control gate disposed over said floating gate, the footprint of said floating gate extending outside the footprint of said floating gate so as to overlap with the portion of the second dielectric layer disposed over the portion of the source/drain regions, wherein the floating gate, the second dielectric layer, and the control gate are disposed symmetrically between the source/drain regions, wherein the control gate substantially conformally wraps around sidewalls of the second dielectric layer and covers a top surface of the second dielectric layer.

11. The memory device of claim 10, further comprising:
a sidewall spacer disposed along and contacting sidewalls of the control gate and the second dielectric layer.

12. The memory device of claim 11, further comprising an electrode disposed over the control gate, wherein the sidewall spacer contacts sidewalls of the electrode.

13. The memory device of claim 10, wherein the control gate is capacitively coupled to the source/drain regions through the second dielectric layer.

14. The memory device of claim 10, wherein the second dielectric layer wraps around all four sidewalls of the floating gate.

15. The memory device of claim 14, wherein the control gate wraps around all four sidewalls of the second dielectric layer.

16. A floating gate memory device, comprising:
source/drain regions disposed in a semiconductor substrate;
a first dielectric layer disposed at a major surface of the semiconductor substrate;
a floating gate disposed over the first dielectric layer, the floating gate comprising four sidewalls that form major outer surfaces of the floating gate, wherein the four sidewalls comprise a first sidewall, a second sidewall facing the first sidewall, a third sidewall perpendicular to the first and the second sidewalls, and a fourth sidewall facing the third sidewall and perpendicular to the first and the second sidewalls;
a second dielectric layer disposed over the floating gate, the second dielectric layer substantially wrapping conformally around all the four sidewalls and covering a top surface of the floating gate so as to form outer sidewalls conforming to the first, the second, third, and the fourth sidewalls of the floating gate; and
a control gate substantially wrapping conformally around all four sidewalls of the second dielectric layer and covering a top surface of the second dielectric layer, wherein the floating gate, the second dielectric layer, and the control gate are disposed symmetrically between the source/drain regions, and wherein the control gate overlaps with the portion of the second dielectric layer disposed over the portions of the source/drain regions.

17. The memory device of claim 16, wherein the control gate is capacitively coupled to the source/drain regions through the second dielectric layer.

18. The memory device of claim 16, wherein a portion of the second dielectric layer overlaps with portions of the source/drain regions.

19. The memory device of claim 16, further comprising:
a sidewall spacer disposed along and contacting sidewalls of the control gate and the second dielectric layer.

20. The memory device of claim 19, further comprising an electrode disposed over the control gate, wherein the sidewall spacer contacts sidewalls of the electrode.

21. The memory device of claim 19, further comprising a dielectric block disposed between the portion of the second dielectric layer and the portion of the source/drain regions, wherein the sidewall spacer is disposed on sidewalls of the dielectric block.

22. The memory device of claim 21, wherein the dielectric block surrounds the remaining portions of the sidewalls of the floating gate not wrapped around by the second dielectric layer.

* * * * *